United States Patent
Chuang

(10) Patent No.: US 7,521,636 B1
(45) Date of Patent: Apr. 21, 2009

(54) CONNECTING APPARATUS ADAPTED IN A BOARD MODULE

(75) Inventor: Po-Feng Chuang, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 12/068,802

(22) Filed: Feb. 12, 2008

(30) Foreign Application Priority Data

Oct. 31, 2007 (TW) ................ 96141044 A

(51) Int. Cl.
*H05K 3/30* (2006.01)

(52) U.S. Cl. .................. 174/138 G; 361/758

(58) Field of Classification Search ............ 174/138 G, 174/138 D; 361/758, 759, 804, 742; 439/66
See application file for complete search history.

(56) References Cited

U.S. PATENT DOCUMENTS

| | | | |
|---|---|---|---|
| 5,754,412 A * | 5/1998 | Clavin | 361/804 |
| 6,404,646 B1 * | 6/2002 | Tsai et al. | 361/758 |
| 7,233,503 B2 * | 6/2007 | Chen | 361/804 |

* cited by examiner

*Primary Examiner*—Phuong K Dinh
(74) *Attorney, Agent, or Firm*—Rabin & Berdo, PC

(57) ABSTRACT

A connecting apparatus adapted in a board module is provided. The board module comprises a first board where the connecting apparatus is placed thereon and a second board. The connecting apparatus comprises a cylindrical main body with a bulge formed thereon and a rotary device. The rotary device comprises a rotary plate, a pivot passing through the main body and a protrusion placed near an edge of the rotary plate. When the protrusion fits with a recession of a curve trench of the bulge, the rotary plate is turned aside to cover part of the bulge, thus to connect the first board with the second board.

20 Claims, 6 Drawing Sheets

CONNECTING APPARATUS ADAPTED IN A BOARD MODULE

RELATED APPLICATIONS

This application claims priority to Taiwan Application Serial Number 96141044, filed Oct. 31, 2007, which is herein incorporated by reference.

FIELD OF INVENTION

The present invention relates to a connecting apparatus. More particularly, the present invention relates to a connecting apparatus adapted in a board module.

DESCRIPTION OF RELATED ART

Computers have become an indispensable device in daily life. Computers can deal with documents, compute the data of experiments, provide multimedia entertainment and spread information through the internet. The laptop is especially very popular because of its convenience.

The conventional laptop uses screws to enhance the connection between the main board and the plate modules such as a network card, graphics card and sound card. In order to make the screws tight enough to lock the plate modules, gum is used on the screw to prevent loosing. However, Adding gum on the screw would decrease the times for using and increase the material and the cost of the product. Furthermore, the procedure to lock the plate modules with screws is time consuming.

Accordingly, what is needed is a connecting apparatus that can avoid the inconvenience, the waste of time and the increase of cost with the use of screws described above to overcome the above issues. The present invention addresses such a need.

SUMMARY

The invention provides a connecting apparatus comprising: a cylindrical main body comprising a hole placed eccentrically passing through the main body; a bulge comprising a curve trench formed on the top of the cylindrical main body wherein the curve trench comprises two recession on two ends of the curve trench; and a rotary device that can make a relative rotation to the cylindrical main body, wherein the rotary device comprises: a rotary plate; a pivot placed eccentrically on the rotary plate wherein the pivot is passing through the hole on the main body; and a protrusion placed near an edge of the rotary plate, wherein the protrusion can fit with one of the recessions of the curve trench of the bulge.

Another object of the present invention is to provide a board module comprising: a first board; at least one connecting apparatus placed on the first board, wherein the connecting apparatus further comprising: a cylindrical main body comprising a hole placed eccentrically passing through the main body; a bulge comprising a curve trench formed on the top of the cylindrical main body wherein the curve trench comprises two recessions on two ends of the curve trench; a rotary device that can make a relative rotation to the cylindrical main body, wherein the rotary device comprises: a rotary plate; a pivot placed eccentrically on the rotary plate wherein the pivot is passing through the hole on the main body; and a protrusion placed near an edge of the rotary plate, wherein the protrusion can fit with one of the recessions of the curve trench of the bulge; and a second board having at least one hole corresponding to the at least one connecting apparatus, wherein the shape and size of the at least one hole and the bulge of the at least one connecting apparatus are substantially the same.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
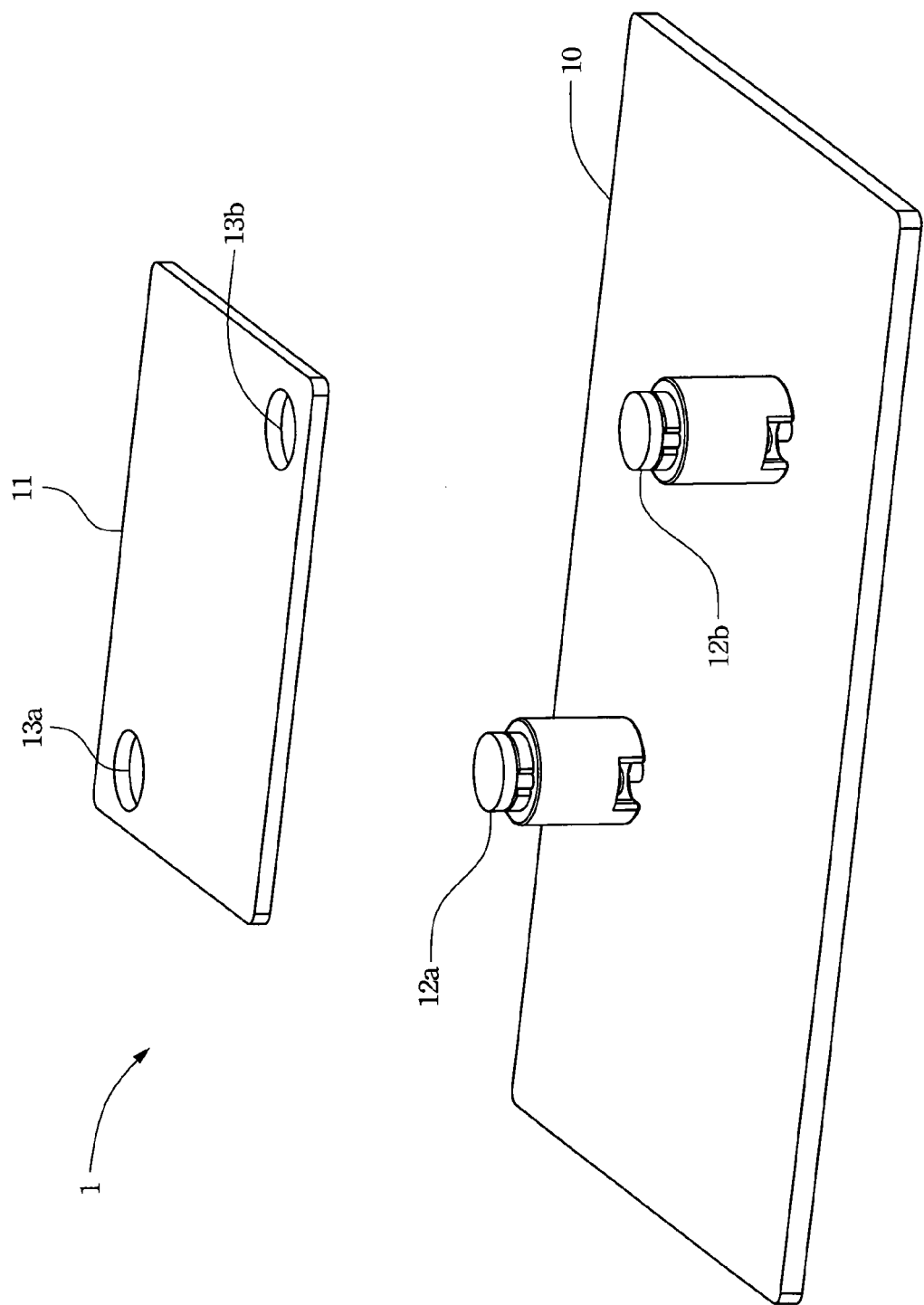
FIG. 1 is a diagram of a board module and a connecting apparatus of an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1, an exploded view of a board module 1 and a connecting apparatus of an embodiment of the present invention. The board module 1 comprises a first board 10, a second board 11 and two connecting apparatus 12 (connecting apparatus 12a and connecting apparatus 12b). The second board 11 has two holes 13a and 13b. The number of connecting apparatus depends on the actual application. The present embodiment is illustrated with two connecting apparatus 12a and 12b.

Figure 2A:
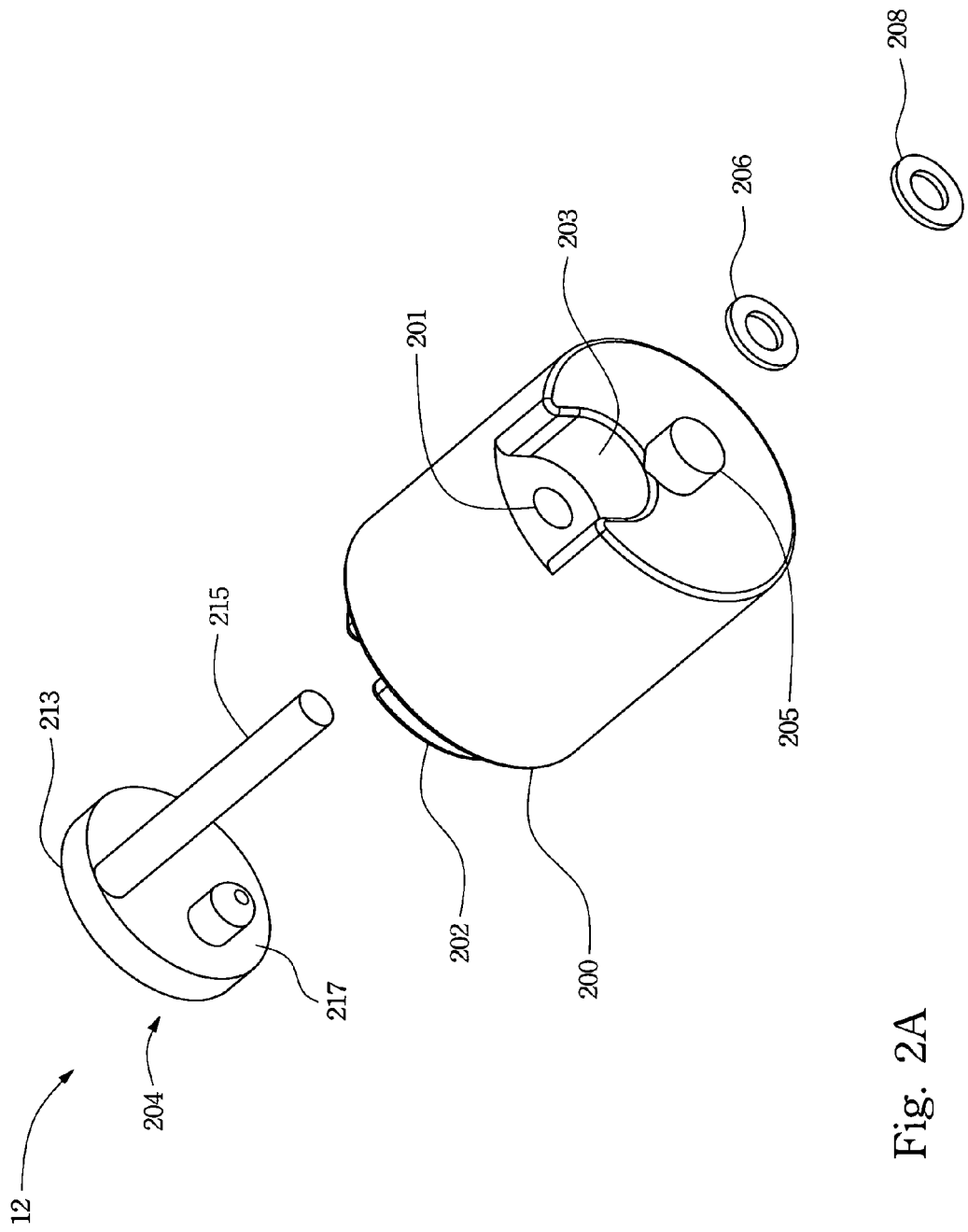
FIG. 2A is an exploded view of the connecting apparatus of FIG. 1.
Figure 2B:
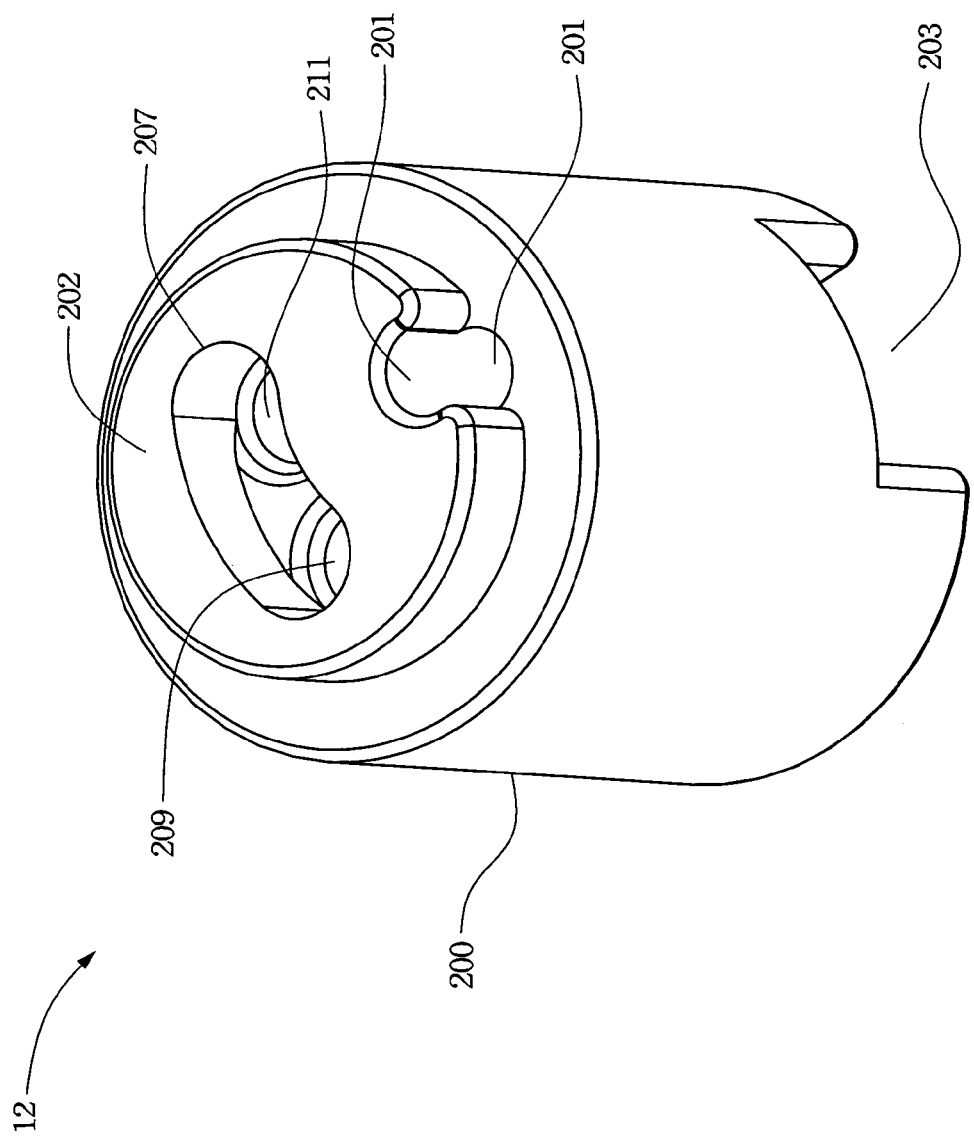
FIG. 2B is a perspective view of the cylindrical main body and the bulge of the connecting apparatus of FIG. 1.

Please refer to FIG. 2A and FIG. 2B at the same time, wherein FIG. 2A is an exploded view of the connecting apparatus 12 and FIG. 2B is a perspective view of a cylindrical main body 200 and a bulge 202 of the connecting apparatus 12.

The connecting apparatus 12 comprises a cylindrical main body 200, a bulge 202, a rotary device 204, a first annular elastomer 206 and a second annular elastomer 208. The cylindrical main body comprising a hole 201, a curve breach 203 and an adapter 205. The hole 201 is placed eccentrically passing through the main body. The curve breach 203 is formed on the bottom side of the cylindrical main body 200. The adapter 205 is formed on the bottom of the cylindrical main body 200.

Figure 2C:
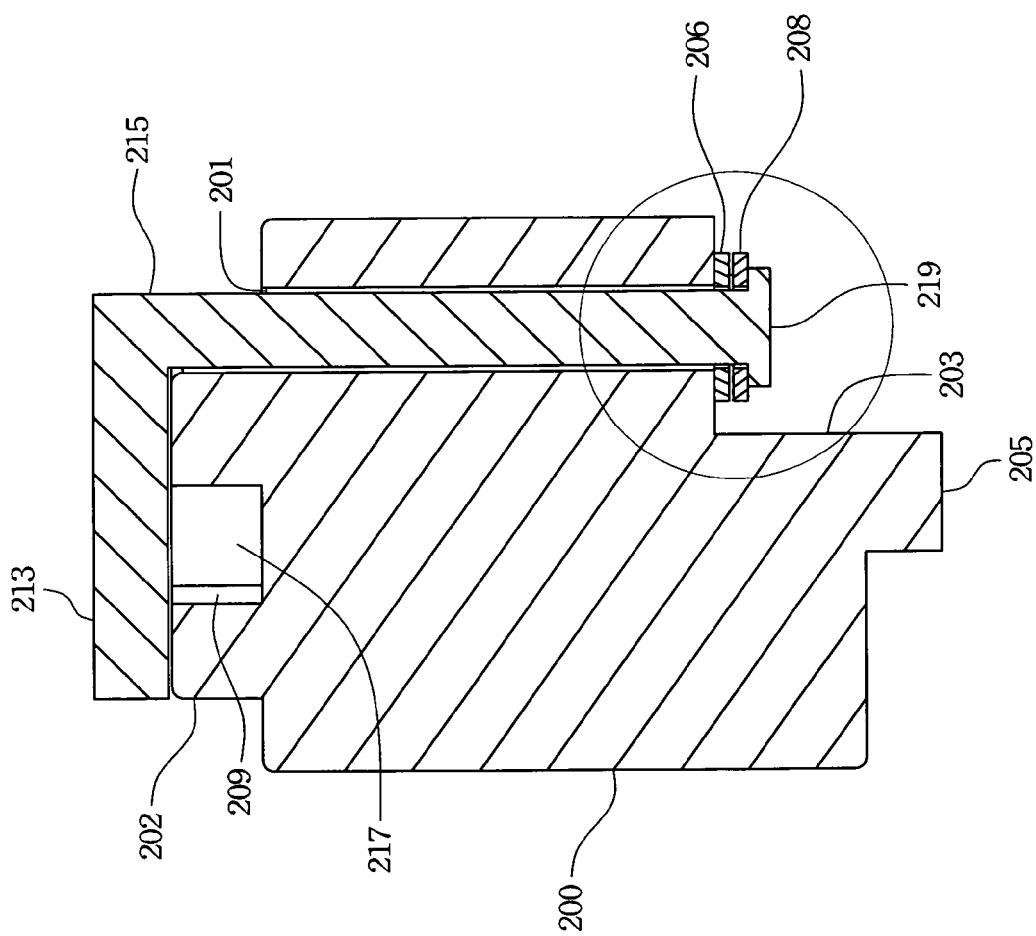
FIG. 2C is a cross-sectional view of the connecting apparatus of FIG. 1.

Please refer to FIG. 2B, the bulge 202 is formed on the top of the cylindrical main body 200. The bulge 202 comprises a curve trench 207 formed on the top of the cylindrical main body 200 wherein the curve trench 207 comprises two recessions 209 and 211 on two ends of the curve trench 207. In the present embodiment, the curve trench 207 further comprises a hole 201' corresponding the hole 201 of the cylindrical main body 200. The rotary device 204 comprises a rotary plate 213, a pivot 215 and a protrusion 217. The shape and size of the rotary plate 213 is adaptive with the bulge 202. The pivot 215 is placed eccentrically on the rotary plate 213 wherein the pivot 215 is passing through the hole 201 and 201'. The protrusion 217 is placed near an edge of the rotary plate 213, wherein the protrusion 217 can fit with either the recession 209 or the recession 211 of the curve trench 207 of the bulge 202. The first annular elastomer 206 circles the pivot 215 of the rotary device 204 and the second annular elastomer 208 is placed underneath the first annular elastomer 206 wherein the first annular elastomer 206 and the second annular elastomer 208 are provided within curve breach 203. Please refer to FIG. 2C, a cross-sectional view of the connecting apparatus 12. The pivot 213 further comprises a blocking device 219 on the bottom of the pivot 213 to prevent the first annular elastomer 206 and the second annular elastomer 208 from slipping out of the pivot 215.

Figure 3A:
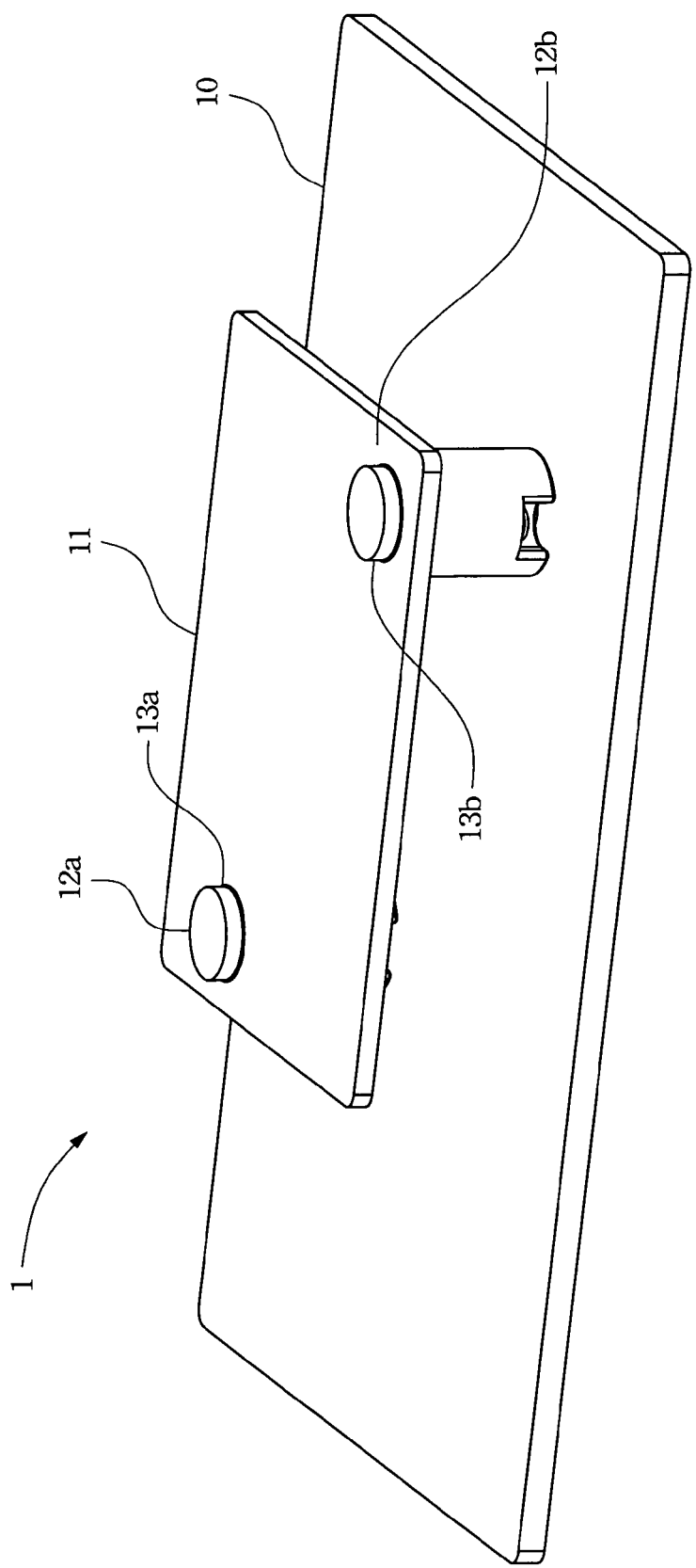
FIG. 3A is a 3-dimensional view of the board module of FIG. 1.

Please refer to FIG. 3A, a 3 dimensional view of the board module 1 of the present embodiment. The adapter 205 of the connecting apparatus 12a and 12b is respectively adapted to the first board 10 with, but not necessarily with, a surface mount technology. When the protrusion 217 fits with the recession 209 of the curve trench 207 of the bulge 202, the rotary plate 213 covers the bulge 202. The shape and size of holes 13a and 13b of the second board 12 are substantially adaptive with the bulge 202 of each connecting apparatus; and the height of the bulge 202 of the each of the connecting apparatus and the second board 12 are substantially the same. The second board 11 is connected with the two connecting apparatus 12a and 12b through the holes 13a and 13b.

Figure 3B:
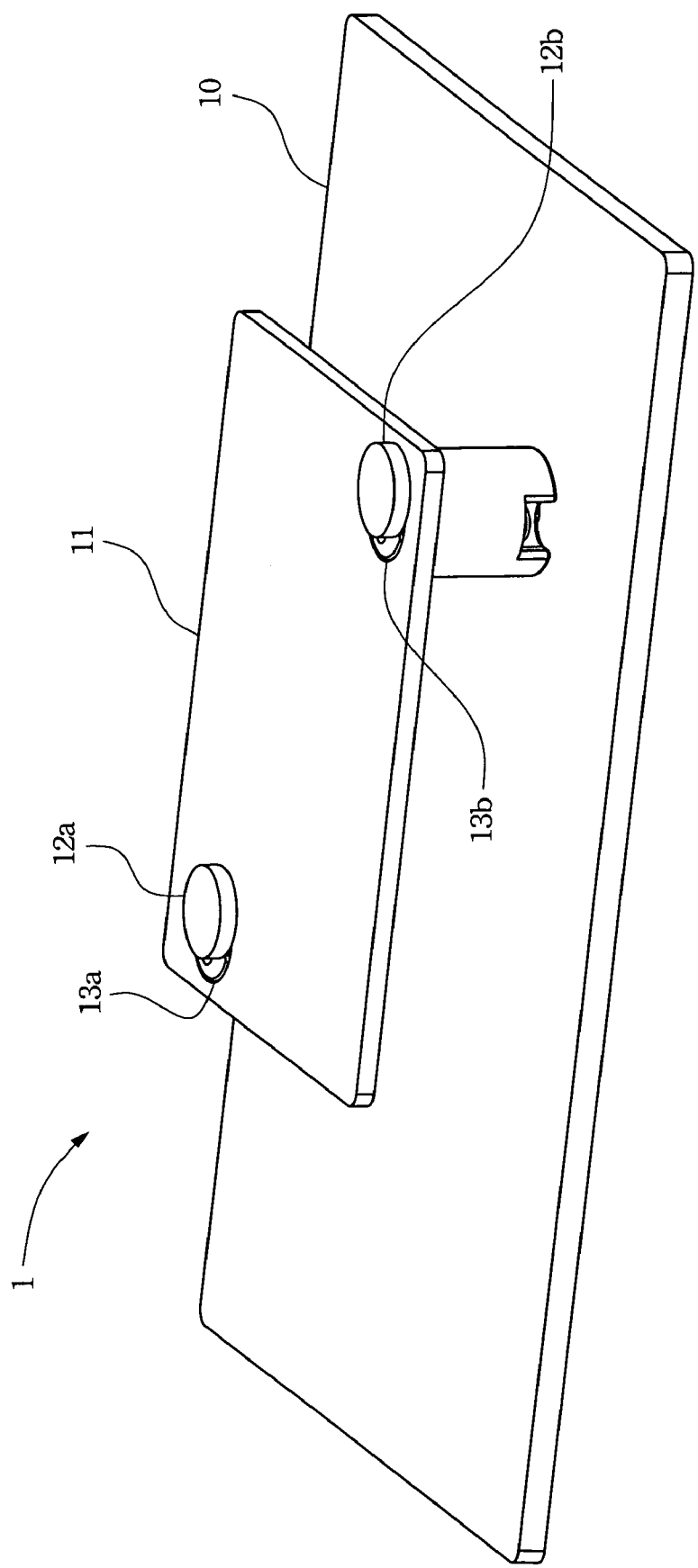
FIG. 3B is another 3-dimensional view of the board module of FIG. 1.

Please refer to FIG. 3B, another 3-dimensional view of the board module 1 of the present embodiment. After connecting the second board 12 with the connecting apparatus 12a and 12b, the rotary plate 213 can be turned to make the protrusion 217 cross the curve trench 207 to the other recession 211. Due to two opposite ends of the first annular elastomer 206 contacts with the curve breach 203 and the second annular elastomer 208 respectively and tightly, while the protrusion 217 moving from the recession 209 to the recession 211, the first annular elastomer 206 is compressed and generate a supporting strength such that the protrusion 217 can cross the part of the curve trench 207 between the two recessions 209 and 211 to reach the recession 211 and make the rotary plate 213 eccentrically cover part of the bulge 202. Hence, the second board 12 is locked with the first board 11.

The above embodiment shows that when the protrusion fits with the recession of the curve trench of the bulge, the rotary plate is turned aside to cover part of the bulge to provide a locking mechanism to connect the second board and the first board without the use of screws.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A connecting apparatus comprising:
   a cylindrical main body comprising a hole placed eccentrically passing through the main body;
   a bulge comprising a curve trench formed on the top of the cylindrical main body wherein the curve trench comprises two recessions on two ends of the curve trench; and
   a rotary device that can make a relative rotation to the cylindrical main body, wherein the rotary device comprises:
   a rotary plate;
   a pivot placed eccentrically on the rotary plate wherein the pivot is passing through the hole on the main body; and
   a protrusion placed near an edge of the rotary plate, wherein the protrusion can fit with one of the recessions of the curve trench of the bulge.

2. The connecting apparatus of claim 1 further comprising a first annular elastomer and a second annular elastomer, wherein the first annular elastomer circles the pivot of the rotary plate; the second annular elastomer is placed underneath the first annular elastomer.

3. The connecting apparatus of claim 2 further comprising a blocking device on the bottom of the pivot to prevent the first annular elastomer and the second annular elastomer from slipping out of the pivot.

4. The connecting apparatus of claim 3, wherein the cylindrical main body further comprising a curve breach on the bottom side of the cylindrical main body to contain the first annular elastomer, the second annular elastomer and the blocking device within.

5. The connecting apparatus of claim 1, wherein the shape and size of the rotary plate of the rotary device adaptive the bulge.

6. The connecting apparatus of claim 5, when the protrusion fits with o recession of the curve trench, the rotary plate covers the bulge.

7. The connecting apparatus of claim 5, when the protrusion fits with another recession of the curve trench, the rotary plate is turned aside to cover part of the bulge.

8. The connecting apparatus of claim 1, wherein the bulge has a hole corresponding to the hole of the cylindrical main body; the pivot of the rotary device passes through both the holes of the cylindrical main body and the bulge.

9. The connecting apparatus of claim 1, wherein the cylindrical main body further comprising an adapter formed on the bottom of the cylindrical main body.

10. A board module comprising:
    a first board;
    at least one connecting apparatus placed on the first board, wherein the connecting apparatus further comprising:
    a cylindrical main body comprising a hole placed eccentrically passing through the main body
    a bulge comprising a curve trench formed on the top of the cylindrical main body wherein the curve trench comprises two recessions on two ends of the curve trench;
    a rotary device that can make a relative rotation to the cylindrical main body, wherein the rotary device comprises:
    a rotary plate;
    a pivot placed eccentrically on the rotary plate wherein the pivot is passing through the hole on the main body; and
    a protrusion placed near an edge of the rotary plate, wherein the protrusion can fit with one of the recessions of the curve trench of the bulge; and
    a second board having at least one hole corresponding to the at least one connecting apparatus, wherein the shape and size of the at least one hole and the bulge of the at least one connecting apparatus are substantially the same.

11. The board module of claim 10, wherein the connecting apparatus further comprising a first annular elastomer and a second annular elastomer, wherein the first annular elastomer circles the pivot of the rotary device; the second annular elastomer is placed underneath the first annular elastomer.

12. The board module of claim 11, wherein the connecting apparatus further comprising a blocking device on the bottom of the pivot to prevent the first annular elastomer and the second annular elastomer from slipping out of the pivot.

13. The board module of claim 12, wherein the cylindrical main body further comprising a curve breach on the bottom side of the cylindrical main body to contain the first annular elastomer, the second annular elastomer and the blocking device.

14. The board module of claim 10, wherein the shape and size of the rotary plate of the rotary device adaptive the bulge.

15. The board module of claim 14, when the protrusion fits with a recession of the curve trench, the rotary plate can cover the bulge.

16. The board module of claim 14, when the protrusion fits with a recession of the curve trench, the rotary plate is turned aside to cover part of the bulge.

17. The board module of claim 10, wherein the bulge has a hole corresponding to the hole of the cylindrical main body; the pivot of the rotary device passes through both the holes of the cylindrical main body and the bulge.

18. The board module of claim 10, wherein the cylindrical main body further comprising an adapter formed on the bottom of the cylindrical main body.

19. The board module of claim 18, the adapter is adapted to the first board with a surface mount technology.

20. The board module of claim 10, wherein the height of the bulge of the at least one connecting apparatus and the second board are substantially the same.

* * * * *